(12) United States Patent
Harada et al.

(10) Patent No.: US 8,629,004 B2
(45) Date of Patent: Jan. 14, 2014

(54) METHOD OF MANUFACTURING SEMICONDUCTOR MODULES AND SEMICONDUCTOR MODULE

(75) Inventors: Daisuke Harada, Kariya (JP); Hiroshi Ishiyama, Chiryu (JP); Takahisa Kaneko, Okazaki (JP); Yoshikazu Suzuki, Toyota (JP)

(73) Assignees: Denso Corporation, Kariya (JP); Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/173,334

(22) Filed: Jun. 30, 2011

(65) Prior Publication Data

US 2012/0001349 A1    Jan. 5, 2012

(30) Foreign Application Priority Data

Jun. 30, 2010    (JP) ................. 2010-149662

(51) Int. Cl.
  *H01L 21/66* (2006.01)
  *H01L 21/00* (2006.01)
(52) U.S. Cl.
  USPC ............................................ 438/122; 438/15
(58) Field of Classification Search
  USPC ............. 438/18, 119, 122, 15; 257/782, 783, 257/E21.531, E23.01; 374/163, 177, 180; 363/141, 143, 144, 147
  See application file for complete search history.

(56) References Cited

U.S. PATENT DOCUMENTS

| 7,256,431 B2 | 8/2007 | Okamoto |
| 2005/0047101 A1* | 3/2005 | Osanai ..................... 361/760 |

| 2008/0251909 A1* | 10/2008 | Tokuyama et al. ........... 257/706 |
| 2008/0291636 A1* | 11/2008 | Mori et al. .................... 361/709 |
| 2009/0116197 A1* | 5/2009 | Funakoshi et al. ........... 361/719 |
| 2009/0315168 A1* | 12/2009 | Coteus et al. ................. 257/686 |

FOREIGN PATENT DOCUMENTS

| JP | 57-024596 | 2/1982 |
| JP | 7-283499 | 10/1995 |
| JP | 11-204700 | 7/1999 |
| JP | 2004-532529 | 10/2004 |
| JP | 2006-179856 | 7/2006 |

OTHER PUBLICATIONS

Notification of Reasons for Rejection issued for Japanese Patent Application No. 2010-149662, dated Jun. 11, 2013. (with partial English transation).

* cited by examiner

*Primary Examiner* — Walter H Swanson
*Assistant Examiner* — Wilner Jean Baptiste
(74) *Attorney, Agent, or Firm* — Nixon & Vanderhye P.C.

(57) ABSTRACT

A semiconductor module having an integrated structure is manufactured by mounting a semiconductor chip on the side of a surface of a cooling plate via an insulating material, and by molding the semiconductor chip and the cooling plate by a resin-molded member. This method includes the steps of: (a) forming a sprayed insulating film as the insulating material on a surface of the cooling plate; (b) forming a sprayed conductive film on a face of the sprayed insulating film opposite to a face where the cooling plate is provided; (c) checking whether the sprayed conductive film is insulated from the cooling plate by using the sprayed conductive film and the cooling plate as electrodes and applying voltage therebetween; and (d) mounting the semiconductor chip on the upper side of the sprayed conductive film when the sprayed conductive film is insulated, and then resin-molding the semiconductor chip and the cooling plate.

5 Claims, 3 Drawing Sheets

METHOD OF MANUFACTURING SEMICONDUCTOR MODULES AND SEMICONDUCTOR MODULE

CROSS-REFERENCE TO RELATED APPLICATION

This application is based on and claims the benefit of priority from earlier Japanese Patent Application No. 2010-149662 filed Jun. 30, 2010, the description of which is incorporated herein by reference.

BACKGROUND

1. Technical Field

The present invention relates to a method of manufacturing a semiconductor module having an integrated structure, by mounting a semiconductor chip formed with a semiconductor power element on a is plate having cooling fins, followed by resin-molding the semiconductor chip and the plate for integration, and relate to a semiconductor module having a structure suitable for the method, the method being favorably applicable, for example, to a semiconductor module such as of a two-in-one structure in which two semiconductor power elements, i.e. an upper arm (high-side element) and a lower arm (low-side element), are resin-molded.

2. Related Art

A patent document JP-A-H11-204700 discloses a semiconductor module having an integrated structure, which is provided by mounting a semiconductor chip formed with a semiconductor power element on a plate having cooling fins, followed by resin-molding the semiconductor chip and the plate for integration. In this semiconductor module, a semiconductor chip is mounted on a plate having cooling fins via a sheet of insulating material and a heat spreader. The heat spreader is configured by a metal block made such as of copper. The semiconductor chip is resin-molded together with the heat spreader and the insulating material so that the entirety is covered with the mold.

In a semiconductor module having the structure as disclosed in JP-A-H11-204700, a plate having cooling fins is insulated from a semiconductor chip, for example, using an insulating material. In such a structure, a heat spreader is adhered to the plate having cooling fins using resin molding after mounting the insulating material on the plate having cooling fins and then further mounting a copper block and a semiconductor chip. Specifically, parts including the heat spreader are adhered to the plate having cooling fins using the heat and the molding pressure resulting from the resin molding.

However, in the case of a semiconductor module in which an adhesion process is performed as mentioned above, an insulation testing step for checking the presence or absence of pinholes in a resin sheet is carried out after resin molding. Therefore, in the event that insulation failure is found in the course of the insulation testing step, the completed semiconductor modules in question all have to be discarded. From the viewpoint of saving resources, discarding completed semiconductors in this way is not favorable.

SUMMARY

An embodiment provides a method of manufacturing a semiconductor module for which an insulation testing step for checking the occurrence of insulation failure can be performed at a stage preceding resin molding, and provides a semiconductor module having a structure suitable for the method.

As an aspect of the embodiment, a method of manufacturing a semiconductor module having an integrated structure, by preparing a cooling plate and mounting a semiconductor chip formed with a semiconductor power element on the side of a surface of the cooling plate via an insulating material, and by molding the semiconductor chip and the cooling plate by a resin-molded member for integration, includes the steps of: (a) forming a sprayed insulating film as the insulating material on a surface of the cooling plate; (b) forming a sprayed conductive film on a face of the sprayed insulating film opposite to a face where the cooling plate is provided; (c) checking whether or not the sprayed conductive film is insulated from the cooling plate by using the sprayed conductive film and the cooling plate as electrodes and applying voltage between the sprayed conductive film and the cooling plate; and (d) mounting the semiconductor chip on the upper side of the sprayed conductive film when the sprayed conductive film is insulated from the cooling plate, and then resin-molding the semiconductor chip and the cooling plate by the resin-molded member for integration.

DETAILED DESCRIPTION OF THE PREFERRED EMBODIMENTS

With reference to the accompanying drawings, hereinafter are described embodiments. Throughout the drawings, components identical with or similar to each other are given the same numerals for the sake of omitting unnecessary explanation.

First Embodiment

Figure 1:
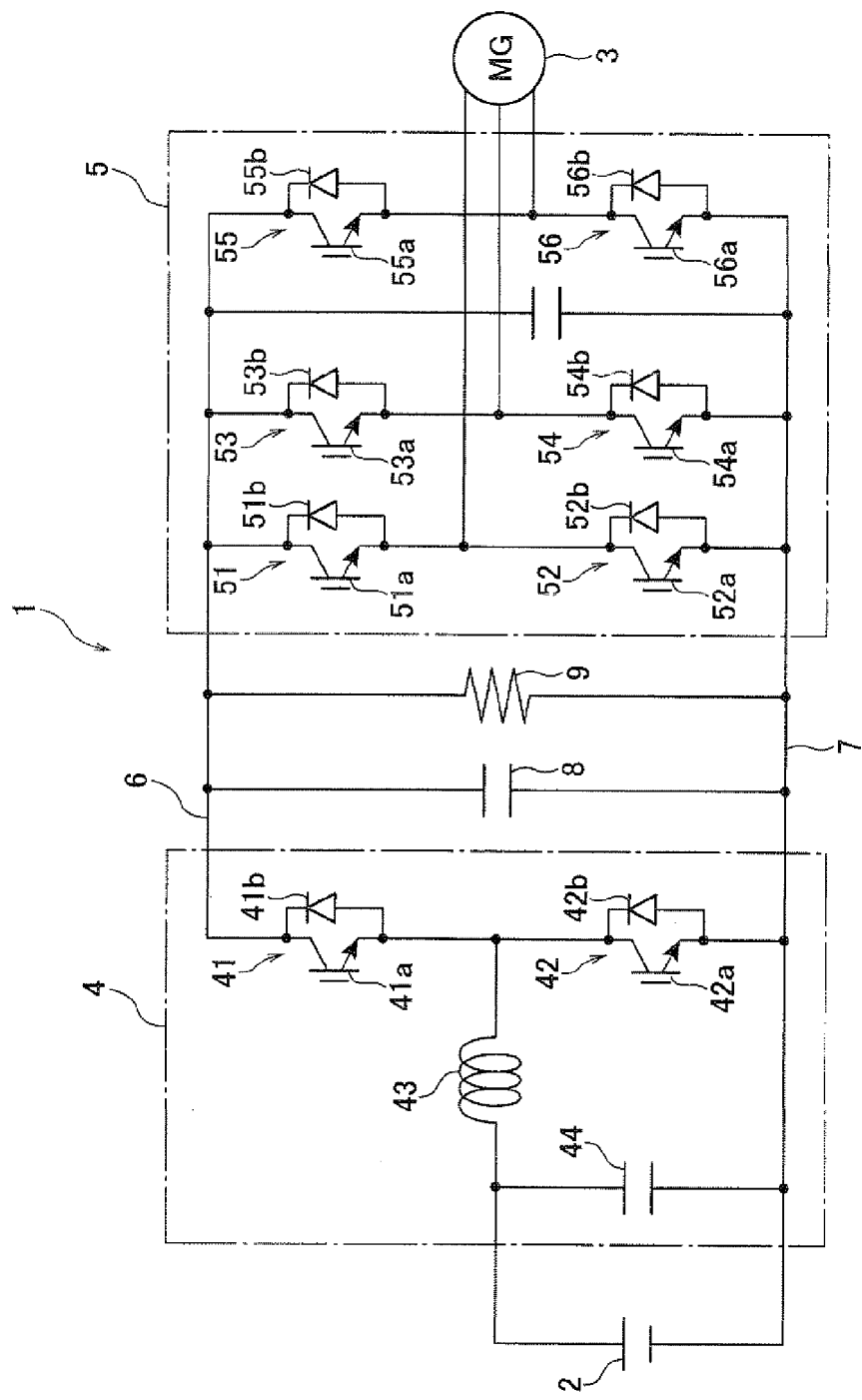
FIG. 1 is a circuit diagram illustrating an inverter to which a semiconductor module according to a first embodiment of the present invention is applied.
Figure 2:
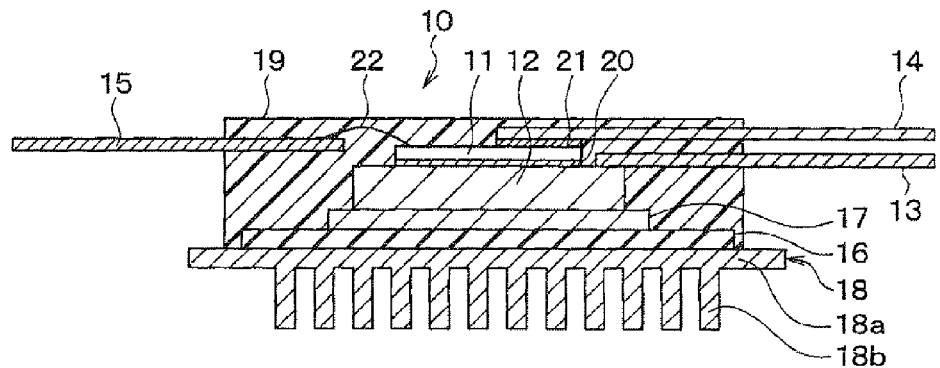
FIG. 2 is a cross-sectional view illustrating the semiconductor module.
Figure 3:
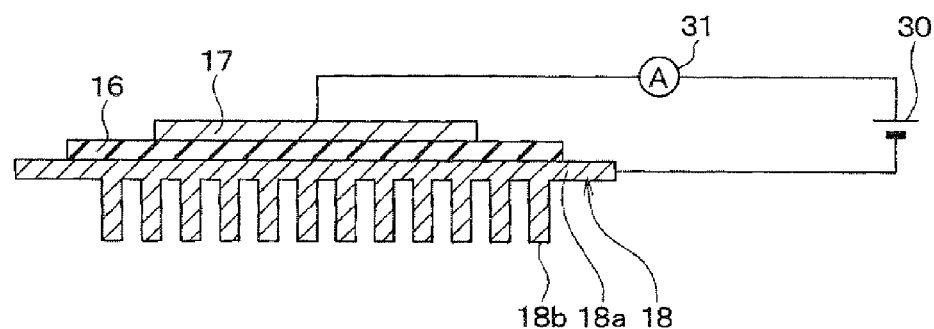
FIG. 3 is a cross-sectional view illustrating an insulation testing step, which is one of the manufacturing steps of the semiconductor module.

Referring to FIGS. 1 to 3, hereinafter is described a first embodiment of the present invention. In the present embodiment, description is given taking, as an example, an inverter for driving a three-phase motor, to which a semiconductor module is applied.

FIG. 1 is a circuit diagram illustrating an inverter 1 to which a semiconductor module 10 of the present embodiment is applied. As shown in FIG. 1, the inverter 1 AC-drives a three-phase motor 3 that is a load, based on a DC power source 2. The inverter 1 includes a step-up circuit 4, an inverter output circuit 5, a power supply line 6 and a ground (GND) line 7.

The step-up circuit 4 is configured by serially connected upper and lower arms 41 and 42, a reactor 43 and a capacitor 44. Specifically, in the step-up circuit 4, the upper arm 41 is configured by an IGBT (insulated gate bipolar transistor) 41a and an FWD (free-wheel diode) 41b connected in parallel. Likewise, the lower arm 42 is configured by an IGBT 42a and an FWD 42b connected in parallel. The upper and lower arms 41 and 42 are connected to the positive electrode of the DC power source 2 via the reactor 43. The capacitor 44 is connected on the side of the DC power source 2 with respect to the reactor 43 so as to be parallel to the DC power source 2.

In the step-up circuit 4 configured in this way, the reactor 43 stores energy based on the power supply from the DC power source 2 when the IGBT 41a of the upper arm 41 is in an OFF-state and the IGBT 42a of the lower arm 42 is in an ON-state. For example, the DC power source 2 is a battery of a 200-V system that provides a voltage of 288 V. Energy is stored in the reactor 43 based on the high voltage of the DC power source 2. When the IGBT 41a of the upper arm 41 is turned ON and the IGBT 42a of the lower arm 42 is turned OFF, the energy stored in the reactor 43 allows a power supply voltage (e.g., 650 V), which is larger than the voltage of the DC power source 2, to be applied to the power supply line 6 for the inverter output circuit 5. A constant power supply voltage is supplied to the inverter output circuit 5 by alternately repeating the ON and OFF operations of the IGBTs 41a and 42a of the upper and lower arms 41 and 42.

The inverter 1 also includes a capacitor 8 and a resistor 9. The capacitor 8 and the resistor 9 are provided between the step-up circuit 4 and the inverter output circuit 5. The capacitor 8 and the resistor 9, being parallel to each other, are connected between the power supply line 6 and the ground (GND) line 7. The capacitor 8, which is a smoothing capacitor, is used for reducing ripple or suppressing noise influence caused at the time of switching the IGBTs 41a and 42a of the upper and lower arms 41 and 42, respectively, of the step-up circuit 4 to thereby form a constant power supply voltage. The resistor 9, which is a discharging resistor, is provided for consuming the energy stored in the capacitor 8 when the IGBT 41a of is the upper arm 41 in the step-up circuit 4 is turned OFF.

The inverter output circuit 5 is configured by upper and lower arms 51 to 56. As shown in FIG. 1, in the inverter output circuit 5, the upper arms 51, 53 and 55 are serially connected to the lower arms 52, 54 and 56, respectively. Three sets of the upper and lower arms, i.e. upper and lower arms 51 and 52, upper and lower arms 53 and 54, and upper and lower arms 55 and 56, which correspond to three phases, are connected in parallel. Midpoint potentials between the upper arms 51, 53 and 55, and the lower arms 52, 54 and 56 are applied to U phase, V phase and W phase of the three-phase motor 3 while being sequentially switched therebetween. Specifically, the upper and lower arms 51, 52, 53, 54, 55 and 56 are configured by IGBTs 51a, 52a, 53a, 54a, 55a and 56a, and FWDs 51b, 52b, 53b, 54b, 55b and 56b, respectively. The IGBTs 51a to 56a of the upper and lower arms 51 to 56 of the individual phases are subjected to ON-OFF control to supply three-phase AC current of different cycles to the three-phase motor 3. Thus, the three-phase motor 3 is driven.

In the present embodiment, at least one of the upper and lower arms 41 and 42 of the step-up circuit 4, or at least one of the upper and lower arms 51 to 56 of the inverter output circuit 5 is configured by a semiconductor module.

FIG. 2 is a cross-sectional view illustrating the semiconductor module 10. Referring to FIG. 2, a configuration of the semiconductor module 10 according to the present embodiment is described.

As shown in FIG. 2, the semiconductor module 10 is configured by a semiconductor chip 11, copper block 12, first and second electric wirings 13 and 14, control terminal 15, sprayed insulating film 16, sprayed aluminum film 17, cooling plate 18 and resin-molded member 19. On top of the cooling plate 18, the semiconductor chip 11, copper block 12, first and second electric wirings 13 and 14, control terminal 15, sprayed insulating film 16 and sprayed aluminum film 17 are arranged. These parts on top of the cooling plate 18 are integrated with the cooling plate 18 by resin molding achieved by the is resin-molded member 19 to provide an integrated structure.

Any one of the upper arms 41, 51, 53 and 55, or any one of the lower arms 42, 52, 54 and 56 is formed in the semiconductor chip 11. Here, a one-in-one structure will be described which is a structure in which only one of the arms 41, 42, 51, 52, 53, 54, 55 and 56 is formed in the semiconductor module 10. However, the present embodiment is applicable to any type of structure, such as a two-in-one structure in which two of the arms 41, 42, 51, 52, 53, 54, 55 and 56 are formed in the semiconductor module 10, or a six-in-one structure in which all of the arms 51, 52, 53, 54, 55 and 56 configuring the inverter output circuit 5 are formed in the semiconductor module 10.

In the present embodiment, the IGBT 41a, 42a, 51a, 52a, 53a, 54a, 55a or 56a, and the FWD 41b, 42b, 51b, 52b, 53b, 54b, 55b or 56b to be formed in the semiconductor chip 11 are formed as vertical elements that pass current in a direction perpendicular to the substrate. Thus, various pads may be formed on the front face and the rear face of the semiconductor chip 11. Specifically, those pads which are connected to the gates of the IGBTs 41a, 42a, 51a, 52a, 53a, 54a, 55a and 56a may be formed on the front face of the semiconductor chip 11. The front face may also be formed with those pads which are connected to the emitters of the IGBTs 41a, 42a, 51a, 52a, 53a, 54a, 55a and 56a and to the cathodes of the FWDs 41b, 42b, 51b, 52b, 53b, 54b, 55b and 56b. Meanwhile, the entire rear face may be used for forming those pads which are connected to the collectors of the IGBTs 41a, 42a, 51a, 52a, 53a, 54a, 55a and 56a and to the anodes of the FWDs 41b, 42b, 51b, 52b, 53b, 54b, 55b and 56b.

The copper block 12 is a member corresponding to a metal block that serves as a heat spreader. On the rear face of the semiconductor chip 11, the copper block 12 is connected, via solder 20, to the collector of the IGBT 41a, 42a, 51a, 52a, 53a, 54a, 55a or 56a and the cathode of the FWD 51b, 52b, 53b, 54b, 55b or 56b.

The first electric wiring 13 configures a positive terminal of the semiconductor chip 11 and is joined to the copper block 12 such as by integral molding or welding. Thus, the first electric wiring 13 is electrically connected to the pads provided at the rear face of the semiconductor chip 11 via the copper block 12. The first electric wiring 13 has an end exposed outside, being drawn out of the resin-molded member 19, the end being opposite to the end joined to the copper block 12. It is so configured that connection is established with an external unit via the exposed portion (the exposed end).

The second electric wiring 14 configures a negative terminal of the semiconductor chip 11. The second electric wiring 14 is electrically connected, via solder 21, to the pads that are connected to the emitter of the IGBT 41a, 42a, 51a, 52a, 53a, 54a, 55a or 56a and the cathode of the FWD 41b, 42b, 51b, 52b, 53b, 54b, 55b or 56b on the front face of the semiconductor chip 11. The second electric wiring 14 has an end exposed outside, being drawn out of the resin-molded member 19, the end being opposite to the end connected to the semiconductor chip 11. It is so configured that connection is established with an external unit via the exposed portion (the exposed end).

The control terminal 15 serves as a gate wiring of the IGBT 41a, 42a, 51a, 52a, 53a, 54a, 55a or 56a. The control terminal 15 is electrically connected to the pad which is connected, via bonding wire 22, to the gate of the IGBT 41a, 42a, 51a, 52a, 53a, 54a, 55a or 56a formed on the front face of the semiconductor chip 11. The control terminal 15 has an end exposed outside, being drawn out of the resin-molded member 19, this end being opposite to the end connected to the semiconductor chip 11. It is so configured that connection is established with an external unit via the exposed portion (the exposed end).

The sprayed insulating film 16 is provided to ensure insulation properties between the copper block 12 and the cooling plate 18. The sprayed insulating film 16 is formed by spraying an insulating material onto the front face that is a flat surface of the cooling plate 18. The sprayed insulating film 16 may only require a thickness sufficient for ensuring insulation properties between the copper block 12 and the cooling plate 18, or in other words, may only require to have a thickness that suppresses formation of pinholes. The spatial extent of forming the sprayed insulating film 16 is set to be broader than the extent of the semiconductor chip 11 or the sprayed aluminum film 17. Specifically, the extent of the sprayed insulating film 16 is set so that the semiconductor chip 11 and the sprayed aluminum film 17 are enclosed within the extent of the insulating film when the semiconductor module 10 is viewed from above.

The sprayed aluminum film 17 is in contact with the copper block 12 through a face of the copper block 12, which face is opposite to the face where the semiconductor chip 11 is arranged. The sprayed aluminum film 17 is formed by spraying aluminum on the front face of the sprayed insulating film 16. The extent of the sprayed aluminum film 17 may only be required to be equal to or larger than that of the semiconductor chip 11 but smaller than that of the sprayed insulating film 16. In other words, the extent of the sprayed aluminum film 17 is only required to include the semiconductor chip 11 when the semiconductor module 10 is viewed from above.

The cooling plate 18 is made of metal, such as copper or aluminum, having high heat conductivity. The cooling plate 18 has a structure which is provided, on its front face side, with a plate part 18a having a flat surface and, on its rear face side opposite to the plate member 18a, with a cooling fin part 18b. After being electrically connected via solders 20 and 21 and the bonding wire 22, the semiconductor chip 11, copper block 12, first and second electric wirings 13 and 14, and control terminal 15 are mounted on the flat surface of the plate part 18a on the front face side of the cooling plate 18, via the sprayed insulating film 16 and the sprayed aluminum film 17.

The cooling fin part 18b may have any shape but, in the present embodiment, a plurality of thin fins are arranged, for example, being elongated in a direction, i.e. a longitudinal direction, with an even interval therebetween. By providing the cooling fin part 18b, the surface area of the cooling plate 18 is increased and thus the heat exchange efficiency is enhanced.

On the front face side of the plate part 18a of the cooling plate 18, the surface may basically be made flat, but is partially recessed in the present embodiment to ensure reinforcement of the joining to the resin-molded member 19.

Prior to forming the resin-molded member 19, the parts mentioned above are mounted on the front face side of the cooling plate 18. Then, the cooling plate 18 mounted with the parts is placed in a mold, followed by casting a resin into the mold to thereby provide the resin-molded member 19. The semiconductor module 10 is covered with the resin-molded member 19 except the exposed portions of the first and second electric wirings 13 and 14, and the control terminal 15. Thus, the parts including the semiconductor chip 11 are protected.

The semiconductor module 10 of the present embodiment has a structure as described above. Referring now to FIG. 3, hereinafter is described a method of manufacturing the semiconductor module 10 of the present embodiment. FIG. 3 is a cross-sectional view illustrating an insulation testing step, which is one of manufacturing steps of the semiconductor module 10.

As shown in FIG. 3, an insulating material is sprayed onto the front face of the cooling plate 18 to form the sprayed insulating film 16. Then, aluminum is sprayed onto the sprayed insulating film 16 to form the sprayed aluminum film 17. Then, a positive electrode wiring and a negative electrode wiring from a power source 30 are connected to the sprayed aluminum film 17 and the cooling plate 18, respectively, used as electrodes. Then, using an ammeter 31, it is checked whether or not current flows through the sprayed aluminum film 17 and the cooling plate 18. When no current flows, it is confirmed that the sprayed aluminum film 17 is electrically insulated from the cooling plate 18 by the sprayed insulating film 16. After eliminating defective items, the process proceeds to the subsequent step.

Subsequently, the semiconductor chip 11, copper block 12, first and second electric wirings 13 and 14, and control terminal 15, which have been electrically connected via the solders 20 and 21 and the bonding wire 22, are mounted on the sprayed aluminum film 17 formed on the cooling plate 18 and the sprayed insulating film 16. The entirety is then placed in a mold, not shown, followed by casting a molding resin into the mold to provide a molded body that is the resin-molded member 19. Thus, the semiconductor module 10 is completed.

As described above, the insulation between the sprayed aluminum film 17 and the cooling plate 18 has already been checked as being assured prior to the step of resin molding. This means that, even when the semiconductor chip 11, copper block 12, first and second electric wirings 13 and 14, and control terminal 15 are mounted on the sprayed aluminum film 17, insulation such as between the copper block 12 and the cooling plate 18 has also been assured. Accordingly, carrying out insulation testing step prior to the step of resin molding does not lead to negating the assurance of electrical insulation after performing resin molding.

As described above, according to the present embodiment, the sprayed insulating film 16 and the sprayed aluminum film 17 are formed on the front face of the cooling plate 18. Then, using the sprayed aluminum film 17 and the cooling plate 18 as electrodes, it is checked whether electric current flows therebetween. Thus, it is checked whether or not electrical insulation is assured between the sprayed aluminum film 17 and the cooling plate 18. Accordingly, the insulation testing step can be performed before molding is achieved by the resin-molded member 19. In this way, in the method of manufacturing the semiconductor module 10 of the present embodiment, the insulation testing step, i.e. a testing for insulation failure, can be performed at a stage preceding resin molding.

Specifically, since the semiconductor module 10 of the present embodiment has a structure in which the sprayed insulating film 16 and the sprayed aluminum film 17 are formed on the front face of the cooling plate 18, the insulation testing step, i.e. a test on insulation failure, can be performed at a stage preceding resin molding as described above.

Second Embodiment

Figure 4:
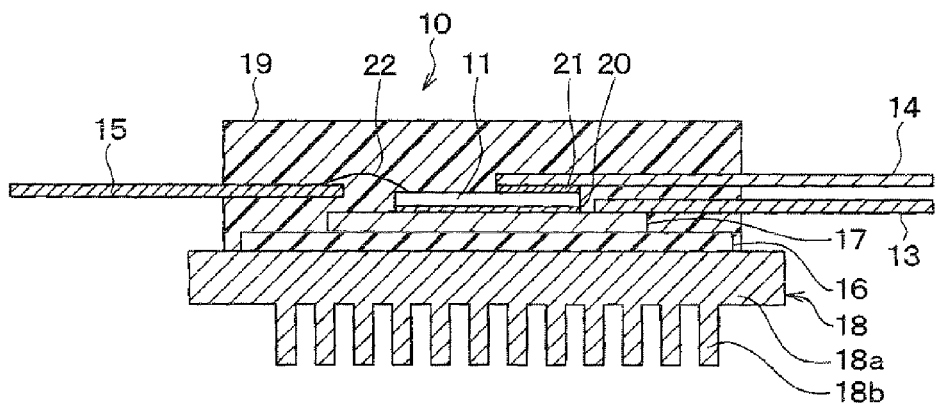
FIG. 4 is a cross-sectional view illustrating a semiconductor module according to a second embodiment of the present invention.

Referring to FIG. 4, hereinafter is described a second embodiment of the present invention. It should be appreciated that, in the second and the subsequent embodiments as well as the modifications, the components identical with or similar to those in the first embodiment are given the same reference numerals for the sake of omitting unnecessary explanation.

The semiconductor module 10 of the second embodiment is different from that of the first embodiment in that the copper block 12 has been omitted, but the remaining configuration is similar to the first embodiment. Therefore, only the difference is described.

FIG. 4 is a cross-sectional view illustrating the semiconductor module 10 according to the second embodiment. As shown in FIG. 4, the copper block 12 is omitted. The rear face of the semiconductor chip 11 is electrically connected to the sprayed aluminum film 17. At the same time, the first electric wiring 13 is electrically connected to the sprayed aluminum film 17. With this configuration as well in which the rear face of the semiconductor chip 11 is in electrical contact with the sprayed aluminum film 17, the advantageous effects similar to those of the first embodiment are exerted.

As in the first embodiment, the arrangement of the semiconductor chip 11 via the copper block 12 exerts an advantageous effect of enhancing the consistency of the adhesion surface of the semiconductor chip 11, and thus allowing the to semiconductor chip 11 to be easily adhered to the cooling plate 18. However, the direct arrangement of the semiconductor chip 11 on the front face of the sprayed conductive film 17, as in the present embodiment, can omit the use of the copper block 12 to thereby reduce the number of parts. Accordingly, the steps, for example, of mounting the part in question, as well as the cost can also be reduced.

Since the copper block 12 is omitted from between the semiconductor chip 11 and the cooling plate 18, the range of heat conduction is narrowed. Accordingly, as shown in FIG. 4, when the copper block 12 is omitted as in the present embodiment, the thickness of the plate part of the cooling plate 18 is made larger than in the first embodiment. Thus, the plate part will play a role of a heat spreader to broaden the range of heat conduction. In this way, heat radiation efficiency is prevented from being lowered from the level of the first embodiment.

Third Embodiment

Figure 5:
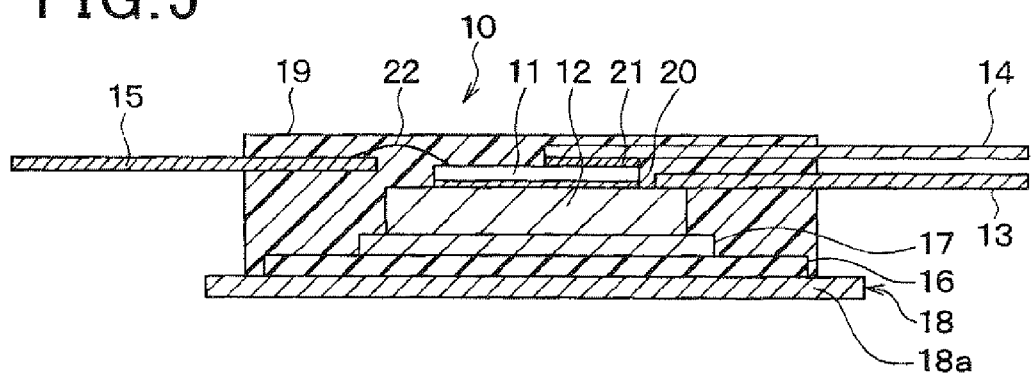
FIG. 5 is a cross-sectional view illustrating a semiconductor module according to a third embodiment of the present invention.

Referring to FIG. 5, hereinafter is described a third embodiment. The semiconductor module 10 of the third embodiment is different from that of the first embodiment in that the configuration of the cooling plate 18 has been changed. Since the remaining configuration is the same as that of the first embodiment, only the difference from the first embodiment is described.

FIG. 5 is a cross-sectional view illustrating the semiconductor module 10 according to the third embodiment. The cooling plate 18 exemplified in the first embodiment has been provided with the cooling fins 18b. However, the cooling plate 18 may not be provided with the cooling fins 18b but may be configured by only the plate part 18a having a shape of a plate. With the formation of the sprayed aluminum film 17 on the front face of the cooling plate 18 via the sprayed insulating film 16, only the plate part 18a without being provided with the cooling fins 18b can exert the advantageous effects similar to those of the first embodiment.

Further, use of the cooling plate 18 merely configured by the plate part 18a can simplify the configuration of the cooling plate 18 and thus can facilitate the fabrication of the cooling plate 18.

Fourth Embodiment

Figure 6:
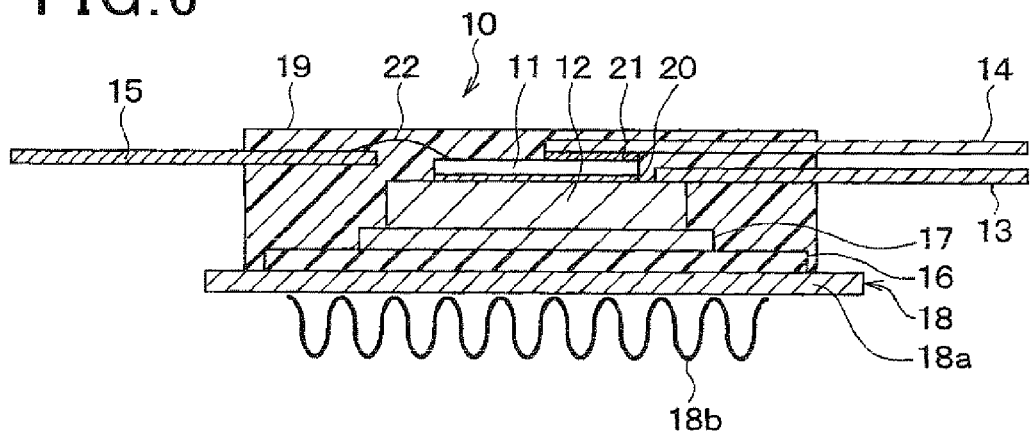
FIG. 6 is a cross-sectional view illustrating a semiconductor module according to a fourth embodiment of the present invention.

Referring to FIG. 6, hereinafter is described a fourth embodiment of the present invention. The semiconductor module 10 of the fourth embodiment is different from that of the first embodiment in that the configuration of the cooling plate 18 and the method of forming the cooling plate 18 have been changed. Since the remaining configuration is similar to that of the first embodiment, only the difference from the first embodiment is described.

FIG. 6 is a cross-sectional view illustrating the semiconductor module 10 according to the fourth embodiment. Similar to the first embodiment, the cooling plate 18 is provided with the radiating fins 18b. However, in the present embodiment, a corrugated single-body structure is used as the radiating fins 18b. The corrugated single-body structure as the cooling fins 18b is connected to the plate part 18a after the step of resin molding for forming the resin-molded member 19 to thereby form the cooling plate 18 of such a structure.

Figure 7:
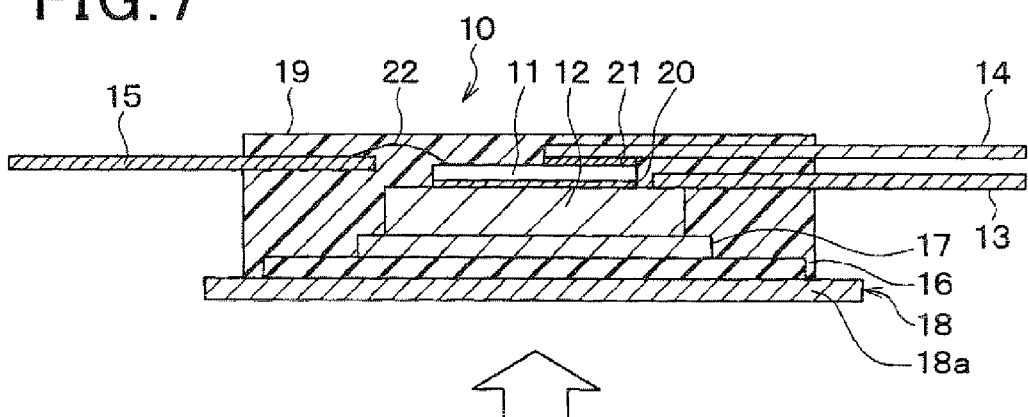
FIG. 7 is a cross-sectional view illustrating a step of connecting cooling fins in manufacturing the semiconductor module according to the fourth embodiment.
Figure 7:
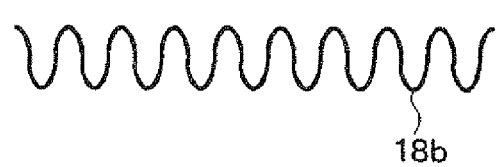

FIG. 7 is a cross-sectional view illustrating the semiconductor module 10, specifically illustrating a step of connecting the corrugated single-body structure as the cooling fins 18b to the plate part 18a, in the process of manufacturing the semiconductor module 10. As shown in FIG. 7, the sprayed insulating film 16 and the sprayed aluminum film 17 are formed on the plate part 18a without having the cooling fins 18b, followed by an insulation testing step. Then, the semiconductor chip 11, copper block 12, first and second electric wirings 13 and 14, and control terminal 15, after being electrically connected via the solders 20 and 21 and the bonding wire 22, are mounted on the sprayed aluminum film 17. Then, the entirety is placed in a mold, not shown, followed by casting a resin into the mold for molding the entirety to configure the resin-molded member 19.

In this case, a molding pressure of the resin is applied to the semiconductor chip 11 and the copper block 12. Accordingly, the semiconductor chip 11 and the copper block 12 are pressed toward the plate part 18a. If resin molding is performed in a state where the cooling fins 18b are provided on the rear face of the plate part 18a, the cooling fins 18b may be deformed by the molding pressure. However, in the present embodiment, resin molding is performed in a state where the cooling plate 18 is provided with only the plate part 18a without being provided with the cooling fins 18b. Accordingly, the cooling fins 18b are prevented from being deformed by the molding pressure.

Subsequently, as shown in FIG. 7, the corrugated single-body structure as the cooling fins 18b is connected to the rear face of the plate part 18a such as by welding to complete the semiconductor module 10.

Thus, a sprayed insulating film forming step, an insulating film forming step, an insulation testing step and a resin molding step are carried out in a state where the cooling plate 18 is only provided with the plate part 18a, and then the cooling fins 18b are connected to the rear face of the plate part 18a. Accordingly, the cooling fins 18b are prevented from being deformed. Thus, lowering of cooling efficiency is prevented, which would have been caused by the deformation of the cooling fins 18b.

(Modifications)

The fourth embodiment set forth above has exemplified the case where the cooling fins 18*b* are connected after resin molding, in the structure where the copper block 12 is provided as in the first embodiment. Alternative to this, however, the cooling fins 18*b* may be connected after resin molding in the structure where the copper block 12 is not provided as in the second embodiment.

In the structure of each of the embodiments described above, the sprayed aluminum film 17 made of aluminum as a conductive material has been provided on the front face of the sprayed insulating film 16, i.e. has been provided on the cooling plate 18 via the sprayed aluminum film 16, the front face being opposite to the face where the cooling plate 18 is provided. Alternative to this, however, the sprayed conductive film may be made of other conductive materials, without being limited to aluminum.

In the embodiments described above, description has been given regarding the inverter 1 that drives the three-phase motor 3. However, the application of the semiconductor module 10 is not limited to the inverter 1. Any entity, when only the entity is at least suitable for being provided with the semiconductor module 10, may be applied with the configuration exemplified in the first, second, third or fourth embodiment. For example, the configuration exemplified in the first, second, third or fourth embodiment may be applied to a converter.

In the embodiments described above, description has been given regarding the configuration in which the IGBT 41*a*, 42*a*, 51*a*, 52*a*, 53*a*, 54*a*, 55*a* or 56*a* and the FWD 41*b*, 42*b*, 51*b*, 52*b*, 53*b*, 54*b*, 55*b* or 56*b* are integrated into the semiconductor chip 11. However, the present invention may be applied to a structure where these elements are each formed in a different chip. Further, a semiconductor power element has been described, taking an IGBT as an example. However, the present invention is applicable to the case where a different element, such as a power MOSFET, is used.

Hereinafter, aspects of the above-described embodiments will be summarized.

As an aspect of the embodiment, a method of manufacturing a semiconductor module having an integrated structure, by preparing a cooling plate (18) and mounting a semiconductor chip (11) formed with a semiconductor power element on the side of (on) a surface of the cooling plate (18) via an insulating material, and by molding the semiconductor chip and the cooling plate by a resin-molded member (19) for integration, includes the steps of: (a) forming a sprayed insulating film (16) as the insulating material on a surface of the cooling plate (18); (b) forming a sprayed conductive film (17) on a face of the sprayed insulating film (16) opposite to a face where the cooling plate (18) is provided; (c) checking whether or not the sprayed conductive film (17) is insulated from the cooling plate (18) by using the sprayed conductive film (17) and the cooling plate (18) as electrodes and applying voltage between the sprayed conductive film (17) and the cooling plate (18); and (d) mounting the semiconductor chip (11) on the upper side of (above or on) the sprayed conductive film (17) when the sprayed conductive film (17) is insulated from the cooling plate (18), and then resin-molding the semiconductor chip and the cooling plate by the resin-molded member (19) for integration.

Thus, the sprayed insulating film (16) and the sprayed conductive film (17) are formed on the front face of the cooling plate (18). After that, the sprayed conductive film (17) and the cooling plate (18) are used as electrodes to check whether electric current flows therebetween. Thus, it is checked whether or not insulation is assured between the sprayed conductive film (17) and the cooling plate (18). Thus, the insulation testing step can be carried out before molding is achieved by the resin-molded member (19). In this way, in the method of manufacturing a semiconductor module, the insulation testing step, i.e. a test on insulation failure, can be carried out at a stage preceding resin molding.

In the method, in step (d), the semiconductor chip (11) is arranged on a surface of the sprayed conductive film (17) via a metal block (12).

Thus, the arrangement of the semiconductor chip (11) via the metal block (12) can enhance the consistency of the adhesion surface of the semiconductor chip (11), thereby facilitating the adhesion of the semiconductor chip (11) onto the cooling plate (18).

In the method, in step (d), the semiconductor chip (11) is directly arranged on a surface of the sprayed conductive film (17).

Thus, direct arrangement of the semiconductor chip (11) on the front face of the sprayed conductive film (17) can omit the use of the metal block (12), unlike the configuration described above, to thereby reduce the number of parts. Accordingly, the steps, for example, of mounting the part in question, as well as the cost can also be reduced.

In the method, the cooling plate (18) is only configured by a plate part (18*a*) having a shape of a plate.

Thus, use of the cooling plate (18) only configured by a plate part (18*a*) having a shape of a plate can simplify the configuration of the cooling plate (18). Accordingly, the cooling plate (18) is easily fabricated.

In the method, in steps (a), (b), (c), and (d), the cooling plate (18) is only provided with a plate part (18*a*) having a shape of a plate. The method further includes the step of (e), after step (d), connecting a cooling fin (18*b*) to the plate part (18*a*) of the cooling plate (18).

Thus, the step of resin molding is carried out in a state where the cooling plate (18) is only provided with the plate part (18*a*), and then the cooling fins (18*b*) are connected to the rear face of the plate part (18*a*). Accordingly, the cooling fins (18*b*) are prevented from being deformed. Owing to this, lowering of cooling efficiency is prevented, which would otherwise have been caused by the deformation of the cooling fins (18*b*).

As another aspect of the embodiment, a semiconductor module having an integrated structure manufactured by preparing a cooling plate (18) and mounting a semiconductor chip (11) formed with a semiconductor power element on the side of (on) a surface of the cooling plate (18) via an insulating material, and by molding the semiconductor chip and the cooling plate by a resin-molded member (19) for integration, includes a sprayed insulating film (16); and a sprayed conductive film (17) which is formed on the side of (on) the surface of the cooling plate (18) via the sprayed insulating film (16), wherein the semiconductor chip (11) is arranged on the upper side of (above or on) the sprayed conductive film (17).

Thus, the semiconductor module has a structure in which the sprayed insulating film (16) and the sprayed aluminum film (17) are formed on the front face of the cooling plate (18). Accordingly, the insulation testing step, i.e. testing for insulation failure, can be carried out at a stage preceding resin molding.

It will be appreciated that the present invention is not limited to the configurations described above, but any and all modifications, variations or equivalents, which may occur to those who are skilled in the art, should be considered to fall within the scope of the present invention.

What is claimed is:

1. A method of manufacturing a semiconductor module having an integrated structure, by preparing a cooling plate and mounting a semiconductor chip formed with a semiconductor power element on a side of a surface of the cooling plate via an insulating material, and by molding the semiconductor chip and the cooling plate by a resin-molded member for integration, comprising the steps of:
   (a) forming a sprayed insulating film as the insulating material on the side of the surface of the cooling plate;
   (b) forming a sprayed conductive film on a face of the sprayed insulating film opposite to a face where the cooling plate is provided;
   (c) checking whether or not the sprayed conductive film is insulated from the cooling plate by using the sprayed conductive film and the cooling plate as electrodes and applying voltage between the sprayed conductive film and the cooling plate; and
   (d) mounting the semiconductor chip on an upper side of the sprayed conductive film when the sprayed conductive film is insulated from the cooling plate, and then resin-molding the semiconductor chip and the cooling plate by the resin-molded member for integration.

2. The method according to claim 1, wherein, in step (d), the semiconductor chip is arranged on a surface of the sprayed conductive film via a metal block.

3. The method according to claim 1, wherein, in step (d), the semiconductor chip is directly arranged on a surface of the sprayed conductive film.

4. The method according to claim 1, wherein, the cooling plate is only configured by a plate part having a shape of a plate.

5. The method according to claim 1, wherein, in steps (a), (b), (c), and (d), the cooling plate is only provided with a plate part having a shape of a plate, and further comprising the step of
   (e) after step (d), connecting a cooling fin to the plate part of the cooling plate.

* * * * *